United States Patent
Iwade et al.

(10) Patent No.: US 7,728,413 B2
(45) Date of Patent: Jun. 1, 2010

(54) RESIN MOLD TYPE SEMICONDUCTOR DEVICE

(75) Inventors: Tomoo Iwade, Nukata-gun (JP); Kuniaki Mamitsu, Okazaki (JP)

(73) Assignee: DENSO CORPORATION, Kariya (JP)

( * ) Notice: Subject to any disclaimer, the term of this patent is extended or adjusted under 35 U.S.C. 154(b) by 452 days.

(21) Appl. No.: 11/515,040

(22) Filed: Sep. 5, 2006

(65) Prior Publication Data
US 2007/0052072 A1    Mar. 8, 2007

(30) Foreign Application Priority Data
Sep. 7, 2005    (JP)    ............... 2005-259352

(51) Int. Cl.
*H01L 23/495* (2006.01)
(52) U.S. Cl. ...................... 257/675; 438/122
(58) Field of Classification Search .................. 257/719, 257/796, 706, 675
See application file for complete search history.

(56) References Cited

U.S. PATENT DOCUMENTS

| | | | |
|---|---|---|---|
| 5,266,834 A * | 11/1993 | Nishi et al. .................. | 257/706 |
| 5,672,910 A | 9/1997 | Majumdar et al. | |
| 7,242,582 B2 * | 7/2007 | Kurauchi et al. ............. | 361/704 |
| 7,405,107 B2 * | 7/2008 | Nakazawa et al. .......... | 438/124 |
| 2003/0022464 A1 * | 1/2003 | Hirano et al. ................ | 438/460 |
| 2004/0183188 A1 * | 9/2004 | Oohama ...................... | 257/706 |
| 2005/0145999 A1 * | 7/2005 | Mamitsu et al. ............. | 257/667 |
| 2005/0167802 A1 * | 8/2005 | Hirano et al. ................ | 257/678 |

FOREIGN PATENT DOCUMENTS

| | | |
|---|---|---|
| JP | A-7-131125 | 5/1995 |
| JP | A-2004-39700 | 2/2004 |
| JP | A-2004-214294 | 7/2004 |
| JP | A-2005-123233 | 5/2005 |

* cited by examiner

*Primary Examiner*—Steven Loke
*Assistant Examiner*—Kimberly M Thomas
(74) *Attorney, Agent, or Firm*—Posz Law Group, PLC

(57) ABSTRACT

A semiconductor device includes: a semiconductor element; a metallic plate having a heat radiation surface; a terminal connecting to the element; and a resin mold covering the element, the plate and the terminal. The metallic plate provides an electrode of the semiconductor element. The heat radiation surface is capable of radiating heat generated in the element. The heat radiation surface and a part of the terminal are exposed from the resin mold. The resin mold includes a concavity/convexity portion between the heat radiation surface and the part of the terminal in order to lengthen a creepage distance therebetween. The concavity/convexity portion is disposed on a surface of the resin mold.

11 Claims, 4 Drawing Sheets

RESIN MOLD TYPE SEMICONDUCTOR DEVICE

CROSS REFERENCE TO RELATED APPLICATION

This application is based on Japanese Patent Application No. 2005-259352 filed on Sep. 7, 2005, the disclosure of which is incorporated herein by reference.

FIELD OF THE INVENTION

The present invention relates to a resin mold type semiconductor device.

BACKGROUND OF THE INVENTION

Heretofore, as a semiconductor device of the specified type, there has been proposed one including a semiconductor element, a metal plate which is connected to the semiconductor element so as to function as the electrode and heat radiation member of the semiconductor element, and one surface of which is a heat radiation surface, terminals which are electrically connected to the semiconductor element, and a mold resin member in which the semiconductor element, the metal plate and the terminals are molded so as to be enveloped, wherein the heat radiation surface of the metal plate and parts of the terminals are exposed from the surface of the mold resin member (refer to, for example, JP-A-2005-123233).

In the semiconductor device of this type, however, the creepage distance between the heat radiation surface of the metal plate as is exposed from the surface of the mold resin member and the parts of the terminals becomes short on account of, for example, the reduction of a package size, and electrical dielectric breakdown, namely, creeping dielectric breakdown might occur between the exposed heat radiation surface and the parts of the terminals.

SUMMARY OF THE INVENTION

In view of the above-described problem, it is an object of the present disclosure to provide a resin mold type semiconductor device.

According to an aspect of the present disclosure, a semiconductor device includes: a semiconductor element; a metallic plate having a heat radiation surface; a terminal electrically connecting to the semiconductor element; and a resin mold covering the semiconductor element, the metallic plate and the terminal. The metallic plate connects to the semiconductor element so that the metallic plate provides an electrode of the semiconductor element. The heat radiation surface of the metallic plate is capable of radiating heat generated in the semiconductor element. The heat radiation surface of the metallic plate and a part of the terminal are exposed from the resin mold. The resin mold includes a concavity/convexity portion disposed between the heat radiation surface of the metallic plate and the part of the terminal in order to lengthen a creepage distance between the heat radiation surface and the part of the terminal. The concavity/convexity portion is disposed on a surface of the resin mold.

In the above device, since the creepage distance between the heat radiation surface and the part of the terminal is lengthened, a creepage dielectric breakdown in the device is prevented.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1A:
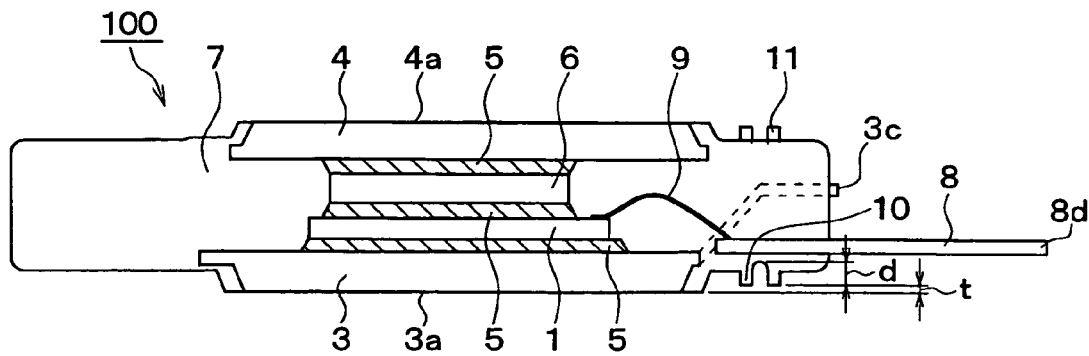
FIG. 1A is a cross sectional view showing a semiconductor device taken along line IA-IA in FIG. 1B.
Figure 1B:
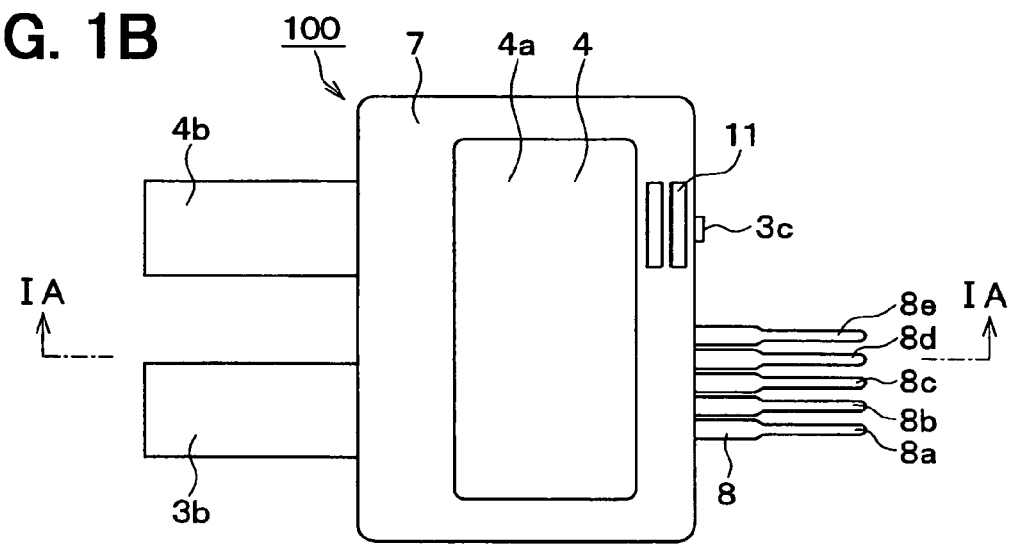
FIG. 1B is a top view showing the semiconductor device.
Figure 1C:
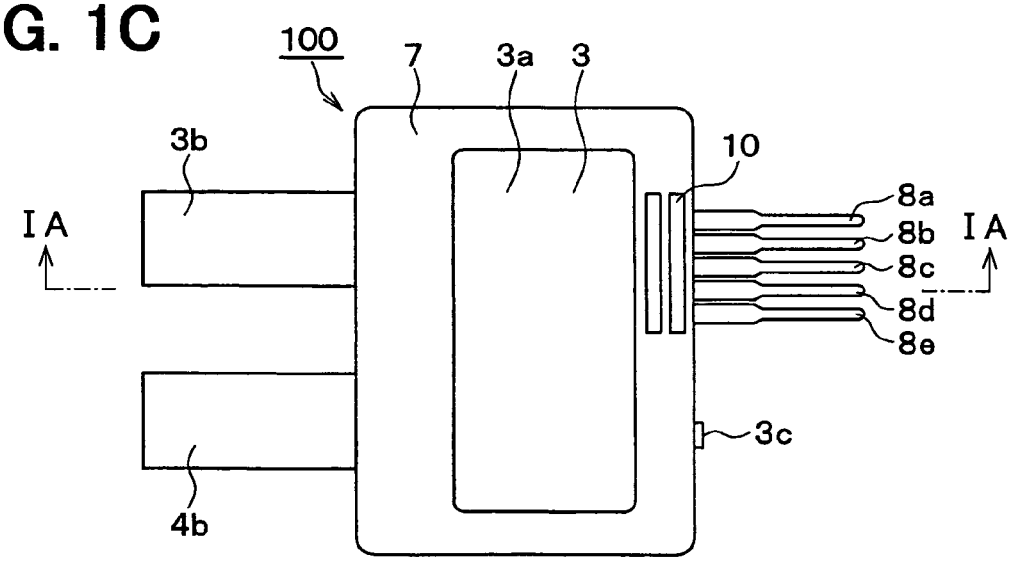
FIG. 1C is a bottom view showing the semiconductor device.

FIGS. 1A through 1C are views showing the schematic configuration of a semiconductor device 100 according to a first example embodiment of the present disclosure. More specifically, FIG. 1A is a schematic sectional view of the semiconductor device, FIG. 1B is a schematic plan view of the semiconductor device in FIG. 1A as seen from above, and FIG. 1C is a schematic plan view of the semiconductor device in FIG. 1A as seen from below. Besides, the schematic sectional view of FIG. 1A is taken along line IA-IA indicated in FIG. 1B, and along line IA-IA indicated in FIG. 1C.

Figure 2:
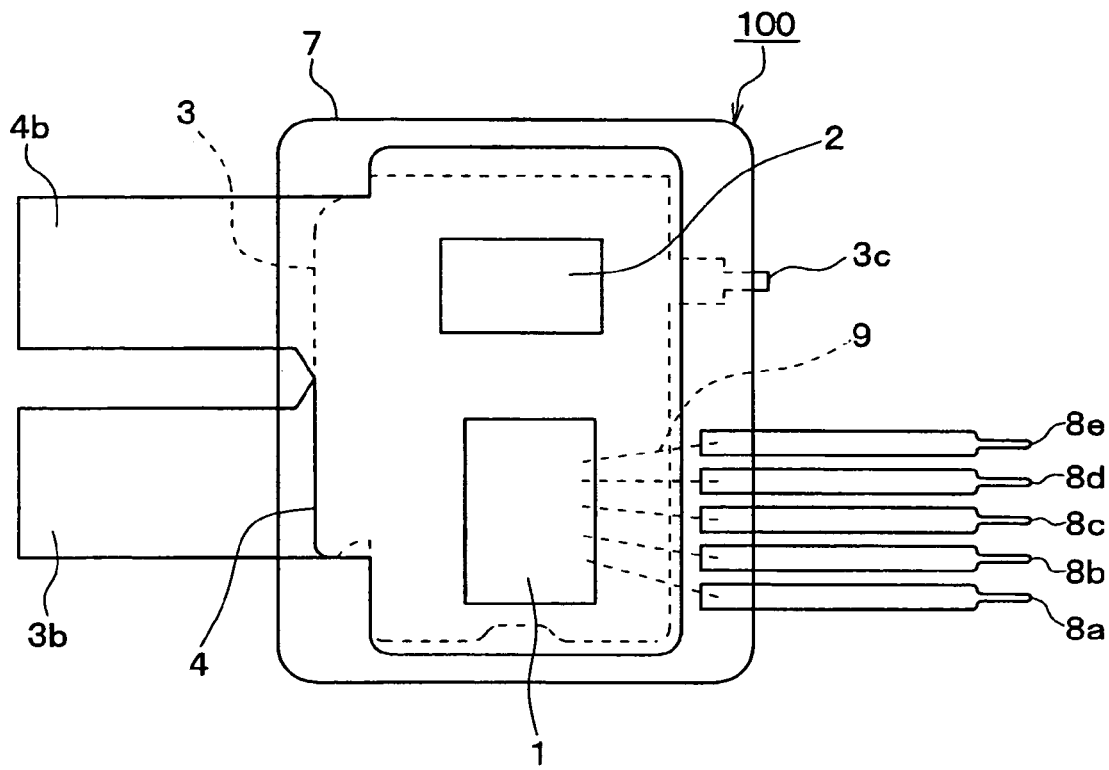
FIG. 2 is a top view showing parts in a resin mold in the device.

FIG. 2 is a view showing the planar arrangement configuration of individual portions within a mold resin member 7 in the semiconductor device 100 shown in FIGS. 1A-1C. The semiconductor device 100 is applied as a device, which is mounted in a vehicle, for example, automobile and which serves to drive a vehicular electron device.

As shown in FIGS. 1A-1C and FIG. 2, the semiconductor device 100 includes two semiconductor elements 1 and 2, which are arranged planarly.

In this example, the first semiconductor element 1 is an IGBT (insulated-gate bipolar transistor) 1, while the second semiconductor element 2 is an FWD (flywheel diode) 2. By the way, in FIG. 1A, a section along the first semiconductor element 1 is shown, and a sectional shape along the second semiconductor element 2 is substantially the same.

Besides, both the surfaces of each of the semiconductor elements 1 and 2 are held between a pair of metal plates 3 and 4 which function as the electrodes and heat radiation members of the semiconductor elements 1 and 2. The metal plates 3 and 4 are made of a metal of high thermal conductivity and high electric conductivity, such as copper alloy or aluminum alloy.

Here, the pair of metal plates 3 and 4 are opposingly arranged so as to hold the semiconductor elements 1 and 2 therebetween. Referring to FIG. 1A, in the pair of metal plates 3 and 4, the metal plate 3 which lies on the lower side shall be termed the "first metal plate 3", and the metal plate 4 which lies on the upper side shall be termed the "second metal plate 4".

In addition, one surface of each of the semiconductor elements 1 and 2 and the inner surface of the first metal plate 3 are electrically and thermally connected by an electrically-conductive bonding member 5 such as solder or electrically-conductive adhesive. Besides, a heatsink block 6 made of the same material as that of both the metal plates 3 and 4 is interposed between the other surface of each of the semiconductor elements 1 and 2 and the second metal plate 4.

Further, each of the semiconductor elements 1 and 2 and the heatsink block 6, and the heatsink block 6 and the inner surface of the second metal plate 4 are electrically and thermally connected by thermally-conductive bonding members 5.

In addition, as shown in FIGS. 1A-1C and FIG. 2, in the semiconductor device 100 of this embodiment, the pair of metal plates 3 and 4 holding the semiconductor elements 1 and 2 therebetween are molded in the mold resin member 7. The mold resin member 7 is made of an epoxy-based resin, and is formed by molding.

Besides, as shown in FIGS. 1A-1C, those outer surfaces 3a and 4a of the respective metal plates 3 and 4 which are opposite to the inner surfaces thereof opposing to the semiconductor elements 1 and 2 are exposed from the mold resin member 7. Thus, the semiconductor device 100 has the configuration of dual-side heat radiation type in which heat is radiated through the first metal plate 3 and the second metal plate 4 on both the surfaces of each of the first and second semiconductor elements 1 and 2.

Although not shown, cooling members are respectively held in close touches with the heat radiation surfaces 3a and 4a exposed from the mold resin member 7, whereby the heat radiations can be promoted. Members of aluminum, copper or the like, in which cooling water is circulatable, are usually used as such cooling members.

Besides, the pair of metal plates 3 and 4 is electrically connected to electrodes, not shown, on the respective surfaces of both the semiconductor elements 1 and 2, through the electrically-conductive bonding members 5 and the heatsink block 6.

Here, as shown in FIGS. 1A-1C and FIG. 2, the semiconductor device 100 is provided with a plurality of terminals 3b, 3c, 4b, and 8a-8e which are electrically connected with the semiconductor elements 1 and 2. These terminals are molded in the mold resin member 7 so as to be partly exposed from this mold resin member 7.

Here in this example, the first metal plate 3 and the second metal plate 4 in the pair of metal plates 3 and 4 function as the electrode on the collector side of the IGBT 1 being the first semiconductor element 1 and the electrode on the cathode side of the FWD 2 being the second semiconductor element 2, and as the electrode on the emitter side of the IGBT 1 and the electrode on the anode side of the FWD 2, respectively.

In addition, among the terminals, a collector lead 3b and collector sense 3c are formed integrally with the first metal plate 3, and they are protrusively exposed outside the mold resin member 7 from the end faces of the first metal plate 3. The collector lead 3b is a terminal for connecting the collector side of the IGBT 1 and the exterior, while the collector sense 3c is an inspecting terminal for the collector of the IGBT 1.

Besides, an emitter lead 4b is formed integrally with the second metal plate 4, and it is protrusively exposed outside the mold resin member 7 from the end face of the second metal plate 4. This emitter lead 4b is a terminal for connecting the emitter side of the IGBT 1 and the exterior.

Further, as shown in FIGS. 1A-1C and FIG. 2, among the terminals, the terminals 8a-8e which are formed by a lead frame 8 being a conductor member separate from the metal plates 3 and 4 are control terminals 8a-8e which are disposed around the IGBT 1 within the mold resin member 7. The lead frame 8 is made of an ordinary lead-frame material such as copper or 42 alloy.

The control terminals 8a-8e are such that their distal end parts protruding from the mold resin member 7 are connected to a circuit board not shown. Besides, as shown in FIG. 2, the IGBT 1 is electrically connected with the control terminals 8a-8e through bonding wire pieces 9 on its surface nearer to the heatsink block 6.

Concretely, in this example, the control terminals 8a-8e consist of a temperature sense cathode 8a, a temperature sense anode 8b, a gate 8c, a current sense 8d and a Kelvin emitter 8e.

The temperature sense cathode 8a and temperature sense anode 8b function as the cathode and anode of a temperature sense diode, not shown, disposed on the chip of the IGBT 1, respectively, and they serve to detect the temperature of the IGBT 1.

Besides, the gate 8c is connected with the gate electrode of the IGBT 1. Further, the current sense 8d functions to detect the abnormality of a current flowing through the IGBT 1, and the Kelvin emitter 8e is an inspecting terminal for the emitter side of the IGBT 1.

Figure 3:
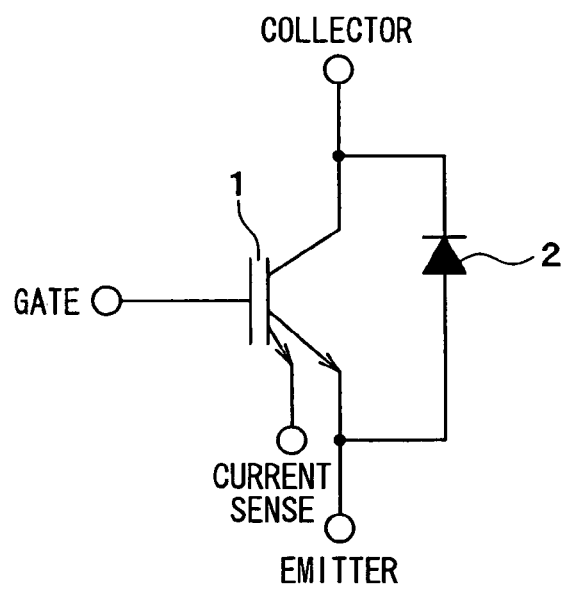
FIG. 3 is a circuit diagram showing an equivalent circuit of the semiconductor device.

In this manner, the terminals of this embodiment include the control terminals 8a-8e which are formed by the lead frame 8 separate from the metal plates 3 and 4, and the terminals 3b, 3c and 4b which are integral with the metal plates 3 and 4. Incidentally, although the functions of the individual terminals 3b, 3c, 4b, and 8a-8e are general ones, an equivalent circuit diagram based on the IGBT 1 and the FWD 2 in the semiconductor device 100 is shown in FIG. 3.

Besides, the heatsink block 6 ensures the distance between the wire bonding surface of the IGBT 1 and the second metal plate 4 in order to keep the height of the wire pieces 9 in performing the wire bonding of the IGBT 1 and the control terminals 8a-8e.

In such a semiconductor device 100, in this embodiment, as shown in FIGS. 1A-1C, rugged portions 10 and 11 are provided at those positions of the surfaces of the mold resin member 7 which lie between the heat radiation surfaces 3a and 4a and parts of the individual terminals as are electrically independent of these heat radiation surfaces 3a and 4a.

Here, the rugged portions 10 and 11 are respectively provided on that surface part of the mold resin member 7 which lies between the heat radiation surface 3a of the first metal plate 3 and the control terminals 8a-8b, and on that surface part of the mold resin member 7 which lies between the heat radiation surface 4a of the second metal plate 4 and the collector sense 3c. Hereinbelow, the rugged portion 10 on the side of the control terminals 8a-8e shall be termed the "control-terminal-side rugged portion 10", while the rugged portion 11 on the side of the collector sense 3c shall be termed the "collector-sense-side rugged portion 11".

The rugged portions 10 and 11 serve to lengthen the creepage distances of the mold resin member 7 at those positions between the heat radiation surfaces 3a and 4a and the parts of the terminal 3c and terminals 8a-8e at which the rugged portions 10 and 11 intervene, by bringing the surfaces of the mold resin member 7 into rugged shapes.

That is, the control-terminal-side rugged portion 10 enlarges the creepage distance of the mold resin member 7 between the heat radiation surface 3a of the first metal plate 3 and the control terminals 8a-8e, and the collector-sense-side rugged portion 11 enlarges the creepage distance of the mold resin member 7 between the heat radiation surface 4a of the second metal plate 4 and the collector sense 3c.

In this example, the rugged portions 10 and 11 are respectively configured of combined structures each of which consists of two convex parts and a concave part formed between them, and which extend so as to interrupt the interspaces between the heat radiation surfaces 3a and 4a and the parts of the terminal 3c and terminals 8a-8e. By way of example, the depth d of the concave part is on the order of several hundred μm in FIG. 1A.

Besides, both the rugged portions 10 and 11 are respectively located at planes parallel to those planes of the surfaces of the mold resin member 7 to which the heat radiation surfaces 3a and 4a are exposed. In addition, both the rugged portions 10 and 11 are recessed with respect to the heat radiation surfaces 3a and 4a.

Concretely, in this example, as shown in FIG. 1A, the distal end parts of the convex parts of both the rugged portions 10 and 11 are recessed with respect to the heat radiation surfaces 3a and 4a. By way of example, the dimension t of the recess is on the order of several hundred μm in FIG. 1A.

Such a semiconductor device 100 is manufactured in the way that, as in the prior art, the semiconductor elements 1 and 2 are held between the metal plate 3 and the heatsink block 6 as well as the metal plate 4, while the IGBT 1 and the control terminals 8a-8e are connected, followed by resin molding.

Here, the rugged portions 10 and 11 are fabricated in the way that the shapes corresponding to these rugged portions 10 and 11 are provided in a forming metal mold. Besides, in the semiconductor device 100, after the resin molding, each of the heat radiation surfaces 3a and 4a is cut along the surface by employing a cutting tool, in order to afford the flatness of each of these heat radiation surfaces 3a and 4a.

Meanwhile, according to this embodiment, the rugged portions 10 and 11 for lengthening the creepage distances between the heat radiation surfaces 3a and 4a at the surfaces of the mold resin member 7 and the parts of the terminal 3c and terminals 8a-8e are provided at those positions of the surfaces of the mold resin member 7 which lie between the heat radiation surfaces 3a and 4a exposed from the mold resin member 7 and the parts of the terminal 3c and terminals 8a-8e.

With this measure, the rugged portions 10 and 11 for lengthening the creepage distances between the heat radiation surfaces 3a and 4a in the surfaces of the mold resin member 7 and the parts of the terminal 3c and terminals 8a-8e are provided in these surfaces, so that the creepage distances between the heat radiation surfaces 3a and 4a and the parts of the terminal 3c and terminals 8a-8e can be gained to suppress creeping dielectric breakdown.

By the way, in the case where the rugged portions 10 and 11 are located in the planes parallel to those planes of the surfaces of the mold resin member 7 to which the heat radiation surfaces 3a and 4a are exposed, they may well be protruded with respect to the heat radiation surfaces 3a and 4a, but they are recessed in this example.

As the reasons therefore, in the cutting works of the heat radiation surfaces 3a and 4a as stated above, the interferences between the cutting tool and the rugged portions 10 and 11 are avoided to suppress the abrasion of this cutting tool, and the interferences between the cooling members and the rugged portions 10 and 11 are prevented to ensure the close touches between the cooling members and the heat radiation surfaces 3a and 4a and to appropriately realize the enhancement of a heat radiation property.

Incidentally, although the two rugged portions 10 and 11 of the control-terminal-side rugged portion 10 and the collector-sense-side rugged portion 11 are provided in this embodiment, only either of the two rugged portions 10 and 11 may well be provided.

By way of example, when that surface part of the mold resin member 7 which lies between the heat radiation surface 3a of the first metal plate 3 and the control terminals 8a-8e is compared with that surface part of the mold resin member 7 which lies between the heat radiation surface 4a of the second metal plate 4 and the collector sense 3c, the creepage distance is comparatively smaller on the side of the control terminals 8a-8e in the semiconductor device 100 shown in FIGS. 1A-1C, in the absence of the rugged portions. In consideration of this point, therefore, the rugged portion 10 may well be provided on only the side of the control terminals 8a-8e.

Figure 4:
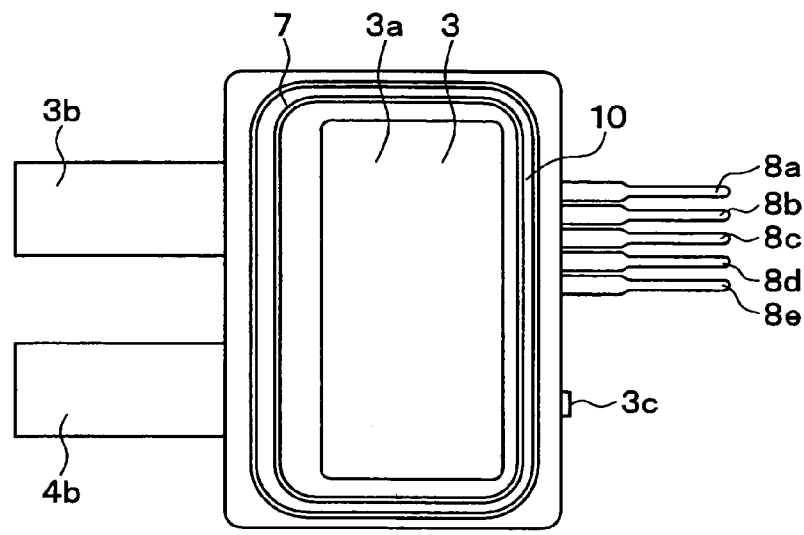
FIG. 4 is a plan view showing another semiconductor device.

FIG. 4 is a schematic plan view of a semiconductor device according to the second example embodiment. In the foregoing embodiment, the rugged portions 10 and 11 have been provided at the positions between the heat radiation surfaces 3a and 4a and the terminal 3c and terminals 8a-8e at the outer peripheries of the heat radiation surfaces 3a and 4a, but a rugged portion 10 may well be provided so as to surround the whole periphery of the heat radiation surface 3a as in the second embodiment here.

In this case, the rugged portion 10 intervenes between the heat radiation surface 3a and all the terminals 4b and 8a-8e which lie around the heat radiation surface 3a and which are electrically independent of this heat radiation surface 3a, and creeping dielectric breakdown through the rugged portion 10 can be prevented.

By the way, in this example, the control-terminal-side rugged portion 10 has been shown as the configuration of the rugged portion surrounding the whole periphery of the heat radiation surface, but the configuration of the rugged portion in this embodiment may well be adopted for the collector-sense-side rugged portion 11.

Figure 5:
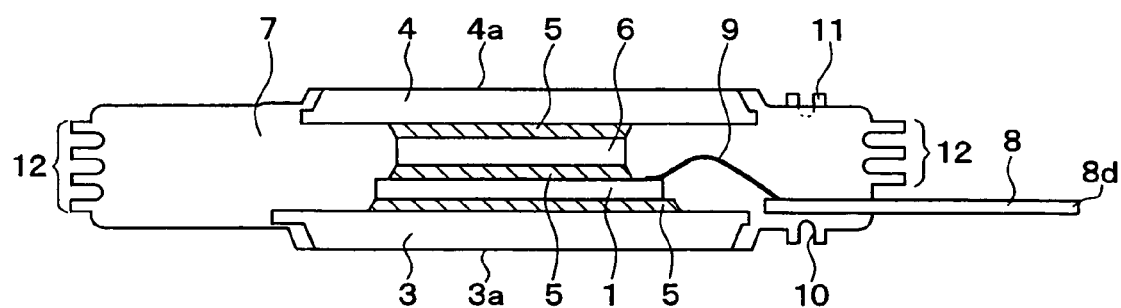
FIG. 5 is a cross sectional view showing further another semiconductor device.

FIG. 5 is a schematic sectional view of a semiconductor device according to the third example embodiment. In each of the preceding embodiments, the rugged portions 10 and 11 have been located at the planes parallel to those planes of the surfaces of the mold resin member 7 to which the heat radiation surfaces 3a and 4a are exposed.

Here, as shown in FIG. 5, rugged portions 12 may well be further provided at planes orthogonal to those planes of the surfaces of the mold resin member 7 to which the heat radiation surfaces 3a and 4a are exposed, in other words, on the side surfaces of the mold resin member 7.

That is, in this embodiment, in the semiconductor device of dual-side heat radiation type, parts of the control terminals 8a-8e are exposed between the respective heat radiation surfaces 3a and 4a of the pair of metal plates 3 and 4 in the surfaces of the mold resin member 7, and the rugged portions 10 and 12 are provided on both the side of one heat radiation surface 3a and the side of the other heat radiation surface 4a, for those parts of the control terminals 8a-8e which are exposed from the mold resin member 7.

In this case, the control terminals 8a-8e can have their creepage distance lengthened, not only for the heat radiation surface 3a of the first metal plate 3 as is comparatively near to these control terminals 8a-8e, but also for the heat radiation surface 4a of the second metal plate 4 as is comparatively remote from them.

Besides, although no illustration is made in FIG. 5, it is possible to expect such advantages as the prevention of the creeping dielectric breakdown between the collector lead 3b or emitter lead 4b and the heat radiation surface 3a or 4a, and the prevention of the creeping dielectric breakdown between both the heat radiation surfaces 3a and 4a.

Incidentally, apart from the combinations of the concave part(s) and convex part(s) as in the illustrated examples, the "rugged portion" may well consist only of a concave part, or it may well consist only of a convex part. Further, it may well consist of a plurality of concave parts or convex parts. Examples of the sectional shapes of such various rugged portions are shown in FIGS. 6A through 6I.

Figure 6A:
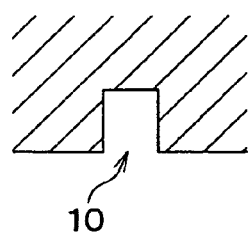
FIGS. 6A to 6I are cross sectional views showing various concavity/convexity portions.
Figure 6B:
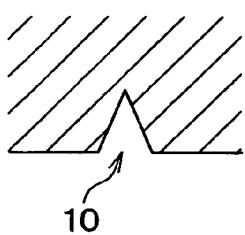
Figure 6C:
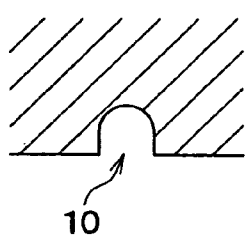
Figure 6D:
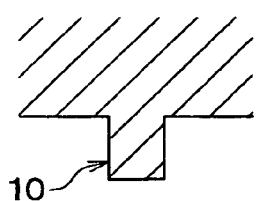
Figure 6E:
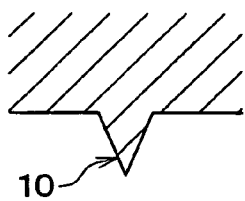
Figure 6F:
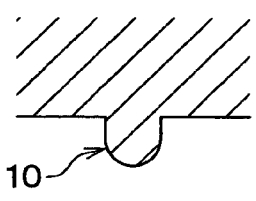
Figure 6G:
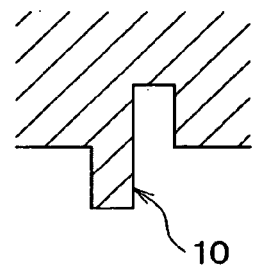
Figure 6H:
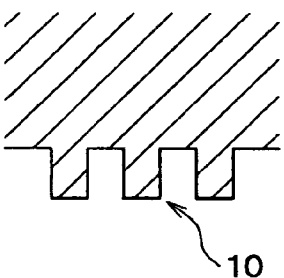
Figure 6I:
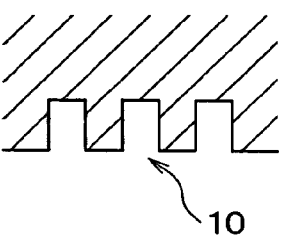

By way of example, the rugged portion 10 shown in each of FIGS. 6A-6C consists only of the concave part, and the rugged portion 10 shown in each of FIGS. 6D-6F consists only of the convex part. Various shapes such as tetragonal, triangular and semicircular shapes can be adopted as the sectional shapes of the concave and convex parts. Besides, the rugged portions 10 which consist of the combination of the concave and convex parts, the plurality of convex parts, and the plurality of concave parts are respectively shown in FIGS. 6G-6I.

Besides, apart from the examples shown in the figures, the rugged portions may well be provided between those parts of the plurality of terminals 3b, 3c, 4b, and 8a-8e which are exposed from the mold resin member 7 and the heat radiation surfaces 3a and 4a. Also, regarding the heat radiation surfaces 3a and 4a or the positions of the individual terminals as are exposed from the mold resin member 7, the illustrated examples are not restrictive.

Besides, each of the embodiments has exemplified the semiconductor device of dual-side heat radiation type, in which the metal plates 3 and 4 are the pair of ones which are opposingly arranged so as to hold the semiconductor elements 1 and 2 therebetween, and those surfaces of the respective metal plates 3 and 4 which are on the sides opposite to the sides of the semiconductor elements 1 and 2 are exposed from the surfaces of the mold resin member 7 as the heat radiation surfaces 3a and 4a.

Here, in such a semiconductor device of dual-side heat radiation type, the semiconductor elements which are held between the pair of metal plates 3 and 4 need not be the IGBT 1 and the FWD 2 stated before, as long as the pair of metal plates 3 and 4 arranged on both the sides of the semiconductor device are employable as the electrodes. Besides, the semiconductor device may well include only one semiconductor element, or three or more semiconductor elements.

Besides, as stated before, the heatsink block 6 intervenes between the IGBT 1 and the second metal plate 4, and it functions to ensure the height between both these members 1 and 4. If possible, however, the heatsink block 6 may well be nonexistent in each of the embodiments.

Further, the invention may well be applied to a single-side heat radiation type as long as a semiconductor device is concerned in which a semiconductor element/semiconductor elements and a metal plate and terminals are connected and are molded in a mold resin member so as to be enveloped, and in which the heat radiation surface of the metal plate and parts of the terminals are exposed from the surface of the mold resin member.

Figure 7:
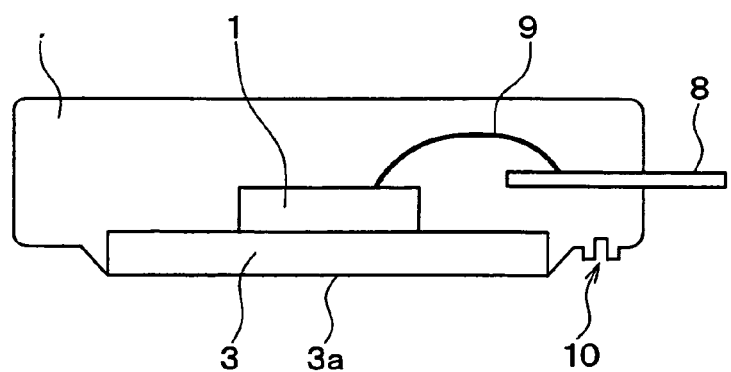
FIG. 7 is a cross sectional view showing a single-side heat radiation type semiconductor device.

FIG. 7 is a schematic sectional view showing an example of the semiconductor device of single-side heat radiation type. The metal plate 3 is electrically and thermally connected to one surface of the semiconductor element 1, the terminals 8 formed by a lead frame or the like are connected to the semiconductor element 1 by bonding wire pieces 9, and the semiconductor element 1, the metal plate 3, the bonding wire pieces 9, and parts of the terminals 8 are molded in the mold resin member 7.

In this case, the rugged portion 10 is formed on the surface of the mold resin member 7 between that heat radiation surface 3a of the metal plate 3 which is exposed from the mold resin member 7 and those parts of the terminals 8 which are similarly exposed from the mold resin member 7.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor element;
a metallic plate having a heat radiation surface;
a terminal electrically connecting to the semiconductor element; and
a resin mold covering the semiconductor element, the metallic plate and the terminal, wherein
the metallic plate connects to the semiconductor element so that the metallic plate provides an electrode of the semiconductor element,
the heat radiation surface of the metallic plate is capable of radiating heat generated in the semiconductor element,
the heat radiation surface of the metallic plate and a part of the terminal are exposed from the resin mold to an outside of the semiconductor device,
the resin mold includes a concavity/convexity portion disposed between the heat radiation surface of the metallic plate and the part of the terminal in order to lengthen a creepage distance between the heat radiation surface and the part of the terminal, and
the concavity/convexity portion is disposed on a surface of the resin mold, the surface of the resin mold parallel to and spaced from the heat radiation surface of the metallic plate,
the concavity/convexity portion includes a protrusion, and where the protrusion is spaced away from a vertical edge of the resin mold and a surface of the resin mold that faces the protrusion,
the protrusion protrudes from the surface of the resin mold to a point between parallel planes containing the heat radiation surface of the metallic plate and the surface of the resin mold, the point being recessed away from the heat radiation surface of the metallic plate.

2. The device according to claim 1, wherein
the metallic plate includes first and second plates, which face each other and sandwich the semiconductor element,
each of the first and second plates has the heat radiation surface and an inner surface,
the inner surface is opposite to the heat radiation surface,
the semiconductor element is sandwiched between the inner surfaces of the first and second plates,
the terminal is integrated with the first plate, and
the concavity/convexity portion is disposed between the part of the terminal and the heat radiation surface of the second plate.

3. The device according to claim 1, wherein
the metallic plate includes first and second plates, which face each other and sandwich the semiconductor element,
each of the first and second plates has the heat radiation surface and an inner surface,
the inner surface is opposite to the heat radiation surface,
the semiconductor element is sandwiched between the inner surfaces of the first and second plates,
the part of the terminal is disposed between the heat radiation surfaces of the first and second plates,
the concavity/convexity portion includes first and second portions,
the first portion is disposed between the part of the terminal and the heat radiation surface of the first plate, and the second portion is disposed between the part of the terminal and the heat radiation surface of the second plate.
4. The device according to claim 1, wherein
the terminal is a conductor member, which is a different member from the metallic plate.
5. The device according to claim 1, wherein
the metallic plate includes first and second plates, which face each other and sandwich the semiconductor element,
each of the first and second plates has the heat radiation surface and an inner surface,
the inner surface is opposite to the heat radiation surface,
the semiconductor element is sandwiched between the inner surfaces of the first and second plates, and
the concavity/convexity portion is disposed between the heat radiation surfaces of the first and second plates.
6. The device according to claim 1, wherein
the concavity/convexity portion surrounds the heat radiation surface of the metallic plate.
7. The device according to claim 6, wherein
the concavity/convexity portion has a ring shape so that the ring shape surrounds the heat radiation surface of the metallic plate.
8. The device according to claim 1, wherein
the concavity/convexity portion further includes a concavity having a rectangular cross section, a triangle cross section, or a U-shaped cross section.
9. The device according to claim 1, wherein
the concavity/convexity portion further includes a convexity having a rectangular cross section, a triangle cross section, or a U-shaped cross section.
10. The device according to claim 1, wherein
the protrusion has at least one of a rectangular cross section, a triangle cross section or a U-shaped cross section.
11. The device according to claim 1, wherein the point is a distal end of the concavity/convexity portion.

* * * * *